United States Patent [19]

Periot

[11] 4,168,443
[45] Sep. 18, 1979

[54] TWO-WIRE PROXIMITY DETECTOR

[75] Inventor: Jean-Marie Periot, Isle-d'Espagnac, France

[73] Assignee: La Telemecanique Electrique, France

[21] Appl. No.: 856,954

[22] Filed: Dec. 2, 1977

[30] Foreign Application Priority Data

Dec. 3, 1976 [FR] France .............................. 76 36635

[51] Int. Cl.² ..................... H01H 36/00; H03K 17/00
[52] U.S. Cl. ................................ 307/308; 307/252 R; 328/5; 361/179
[58] Field of Search ............. 307/308, 252 R; 331/65; 200/D 1; 361/179-181; 340/562; 328/5

[56] References Cited

U.S. PATENT DOCUMENTS

| | | | |
|---|---|---|---|
| 3,743,865 | 7/1973 | Riechmann | 307/308 |
| 3,747,010 | 7/1977 | Buck | 361/180 |

*Primary Examiner*—Stanley D. Miller, Jr.
*Assistant Examiner*—B. P. Davis
*Attorney, Agent, or Firm*—William Anthony Drucker

[57] ABSTRACT

In a two-wire proximity detector, a supply to a probe and auxiliary apparatus is obtained from a bridge rectifier through two regulating circuits of which the first operates when an inhibitor transistor is conducting, while the second operates when the inhibitor transistor is blocked. The first regulating circuit is of the ballast type. The second regulator circuit is of the type which produces a delay in the triggering of a switch thyristor (9). The detector can be fed with an alternating voltage variable over a wide range.

8 Claims, 2 Drawing Figures

TWO-WIRE PROXIMITY DETECTOR

BACKGROUND OF THE INVENTION

The present invention relates to position or proximity detectors, known as "two-wire", comprising a probe sensitive to the position of an object and supplying an activating signal, an electronic switching device actuated by this signal, and a utilizing device, the switching device being bridged across the alternating current mains by means of the utilization device.

In known equipments of this type the switching device, which generally includes a thyristor or other electronic switch, is most frequently connected to the rectified-current terminals of a diode bridge, fed from the mains through the utilization device, while the probe, which usually contains an oscillator or other sensitive circuit needing an auxiliary stable direct-current supply, is fed at the same time as other components of the equipment either from the switching device or from the rectifier bridge.

THE STATE OF THE ART

It is the production of this auxiliary voltage which constitutes the main difficulty in the construction of this type of equipment; a total of only two exterior wires is available.

Effectively, when the electronic switch is closed, the voltage at its terminals is practically zero. According to the previous state of the art it has been proposed to overcome this difficulty either by generating a voltage drop by the insertion of a Zener diode or other resistive regulating device in series with the switching device, or by arranging such a resistive regulating device in parallel with the rectified-current terminals of the bridge, at the same time as an auxiliary thyristor in which there is a systematic retardation of the cyclic triggering by the rectified and unfiltered mains voltage in such a way that the auxiliary voltage could be generated during the delay which separates the said triggering of the passage through zero of the said rectified voltage from the electronic switch.

It is at present considered advisable to be able to feed this type of equipment by means of an alternating voltage variable over wide limits (for example from 20 to 240 volts r.m.s.).

The known solutions recalled above are therefore not satisfactory for high values of supply voltage. In fact the auxiliary voltage cannot be reduced to a convenient value when the switch is open except at the cost of considerable thermal dissipation, which leads to an over-dimensioning of the equipment components completely incompatible with economic needs.

To alleviate this disadvantage, different equipments have been proposed, in which the Zener diode or the auxiliary thyristor are fed at constant current, which limits the consumption at high supply voltages. However, none of these systems solve correctly the problem for the two conditions of the switching thyristor.

OBJECT OF THE INVENTION

The object of the present invention is to provide a two-wire position detector fed with alternating current by a device of reduced consumption, whether the switching device is conducting or not, and over a wide range of mains voltage and with a reduced number of components.

SUMMARY OF THE INVENTION

In a detector, according to the invention, means of connecting the probe device to the command input comprises an inhibiting device which is caused to conduct by the command signal and therefore to hinder the command of the controlled rectifier, and the auxiliary supply device includes a first voltage regulating circuit bridged across the terminals in such a way that the inhibiting device prevents its operation when it is blocked, a second voltage regulating circuit being bridged across the terminals in such a way that it can only operate when the inhibiting device is blocked, the first regulating circuit comprising two complementary conducting paths the impedances of which vary inversely when the mains voltage rises, one of these paths including a first ballast resistor, the second regulator circuit including means for causing delay in the triggering of the controlled rectifier and during this delay, for charging up the capacitor to a voltage which is substantially constant.

The invention will be better understood with the help of the description below.

DESCRIPTION OF THE PREFERRED EMBODIMENT

Figure 1:
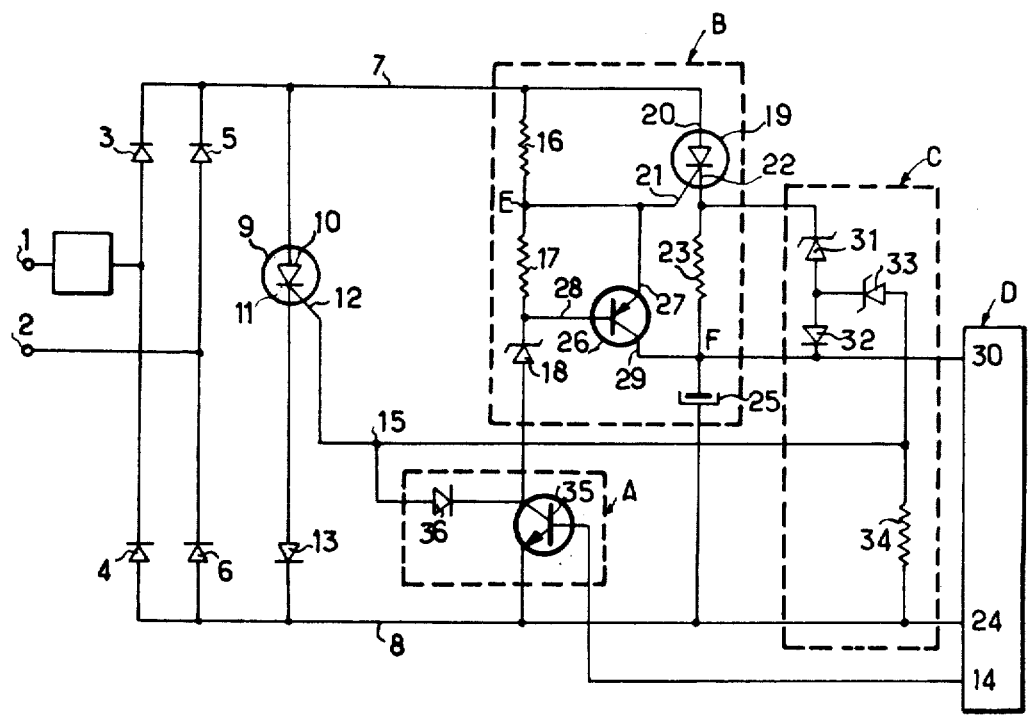
FIG. 1 is a circuit diagram of a proximity detector in conformity with a preferred form of the invention.

The circuit shown in FIG. 1 comprises a rectifier bridge consisting of diodes 3 to 6, fed by the alternating current mains (terminals 1 and 2), through a utilization device U; a switching thyristor 9 bridged across the rectified-current terminals of the bridge; an inhibiting device A enclosed within a chain-dotted line, and consisting of a transistor 35 and a diode 36; a first auxiliary supply circuit B enclosed within a chain-dotted line, a second auxiliary supply circuit C enclosed within a chain-dotted line, and a probe circuit D.

The positive output terminal 7 of the diode bridge and the negative terminal 8 are short-circuited in the conducting condition of the thyristor 9. The latter has an anode 10, a cathode 11 and a trigger 12. A diode 13 is connected in series with the cathode 11, in such a way as to control, in well-known manner, the extinction of the thyristor at the end of a rectified half-wave, if there is no signal on the trigger 12.

When the probe D delivers a command signal at its output terminal 14, the transistor 35 is caused to conduct which results in the suppression, by means of the diode 36 connected through the point 15 to the trigger 12, of the trigger command of the thyristor 9. The latter therefore does not start, which results in the absence of current in the utilization device U; the auxiliary circuit B is therefore rendered operative, which will now be explained.

The circuit B comprises two resistances 16 and 17 in series with a Zener diode 18. These components are fed by the unfiltered rectified voltage present between conductors 7 and 8.

It comprises in addition a semi-conductor ballast component 19, a resistor 23 and a filter capacitor 25 connected in series and also fed by the voltage existing between conductors 7 and 8. Finally, an exciter transistor 26 is connected in parallel between the common point E of the resistors 16 and 17 and the common point F of the resistor 23 and the capacitor 25.

The command electrode 21 of the ballast semi-conductor 19 is excited by a current resulting from the difference between that which traverses the resistor 16 and the current derived by the transistor 26. The latter is driven by the voltage at the terminals of the resistor 17, applied between its emitter 27 and its base 28.

The higher the mains voltage, the lower the apparent resistance of the exciter semi-conductor 26 and the lower the current resulting from the control of the ballast 19. On account of this, the ballast has a higher apparent resistance; the end result is that the sum of the current which passes through it (between its principal electrodes 20 and 22) and the resistor 23 and the current passed by the exciter transistor, a sum which feeds the probe D between its terminals 30 and 24, is constant. The thermal dissipation is therefore low.

If the mains voltage continues to increase, the current passing through the ballast semi-conductor tends gradually towards zero. It becomes zero when the exciter semi-conductor 26 is in the saturated condition; the probe is then fed practically only from the resistor 16, through the principal electrodes 27 and 29 of the semi-conductor 26. Beyond the threshold of mains voltage which produces this result, the first auxiliary circuit therefore no longer functions as a regulator and there is a linear increase in the probe circuit, limited however by the resistor 16.

Figure 2:
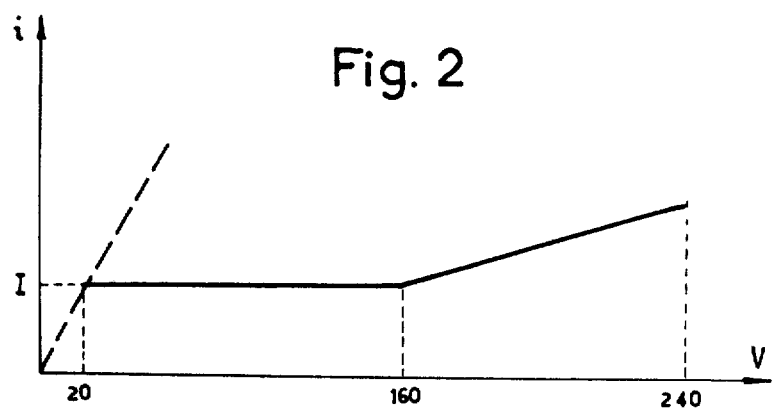
FIG. 2 is a graph showing the current supplied by the first regulating circuit which includes the auxiliary supply device of such a detector, as a function of the mains voltage.

FIG. 2 illustrates this operation. Between the lower mains voltage threshold (20 V r.m.s. for example) and a threshold of 160 V r.m.s., the current i passing through the probe is stabilized at a value I; beyond 160 V and up to the maximum permissible, 240 V r.m.s. for example, this current increases linearly, but with a slope very much less than that which would be necessary in order to ensure operation for the lower threshold of mains voltage, that is, with a reduced thermal dissipation with that which occurs in orthobox circuits.

Although the ballast semi-conductor 19 could, in principle, be a "high-voltage" transistor, it is advantageous in practice to use a thyristor operating as a transistor, i.e. with an anode current lower than the maintaining current, which is a function of the current drawn by the trigger. Because of this the circuit possesses great reliability, every mains over-voltage momentarily making the ballast conduct without deterioration of its characteristics; in addition a high demand current is assured upon switching on.

Where the probe D does not deliver a signal at its terminal 14 the inhibitor A does not conduct and the first auxiliary circuit B for stabilization at constant intensity is therefore inactive; in this case the stabilization of supply voltage for the probe is obtained by means of the second auxiliary circuit C, in the following manner.

The circuit C comprises a diode 32 the cathode of which is connected to the point F, a Zener diode 31 the anode of which is connected to the anode of the diode 32 and the cathode of which is connected to that of the semi-conductor 19 and a Zener diode 33 the cathode of which is connected to the common point of the diode 32 and the Zener diode 31 and of which the anode is connected to the junction point 15. A resistor 34 connects the point 15 to the conductor 8.

On switching on the mains, the current passing through the resistor 16, the path command electrode 21 to cathode 22 of the ballast and the resistor 23, initiates the diode conduction of the ballast 19, causing rapid charging of the filter capacitor 25 up to a value such that the voltage at the junction point between diode 32 and Zener diode 33 exceeds the threshold voltage of the latter.

The Zener diode 33 then supplies current to the trigger 12 of the switching thyristor 9 and the associated resistor 34. The switching thyristor then starts and extinguishes as a matter of course upon the passage through zero of decreasing values of the non-filtered rectified current present in conductors 7 and 8.

The cyclic re-starting of the ballast is effected later in the course of each rise of said voltage each time that the latter exceeds the voltage at the terminals of the capacitor 25, augmented by the voltage drop in the diode 32, thus ensuring the operation (by delaying the cyclic starting) of the thyristor 9. Thus between the start of the rise in voltage between the conductors 7 and 8 and the re-starting of the thyristor 9, that is to say as long as the capacitor 25 is charged, the voltage at the terminals of this capacitor does not exceed the difference of the voltage drops at the terminals 33 and 32.

The resistor 34 being of a low value, the mean charge voltage of the filter capacitor 25, and therefore the supply voltage to the probe D, is stabilized at a value equal to the difference of the voltage drops in the diodes 33 and 32, with a variation of the order of one volt.

The delay in the cyclic starting obtained in this way from the fact that it does not make use of any devices in series with the switching thyristor, ensures a low thermal dissipation whatever the mains voltage and this all the more as the delay in starting decreases when the mains voltage increases.

Various modifications could be made to the circuit which has been described without departing from the scope of the invention as defined by the appended claims.

I claim:

1. In a detector of the size of a physical parameter, and more particularly, a proximity detector, capable of operation over a wide range of a.c. mains voltage, of the kind having a probe giving a command signal, a rectifier bridge bridged across the mains through a utilization device, a semi-conductor-controlled rectifier bridged across the direct-current terminals of the rectifier bridge and having a command input, means for connecting the probe to said command input, and an auxiliary supply device connected to the said direct-current terminals, the improvement which comprises the means for connecting the probe to said command input comprises an inhibitor device rendered conducting by the command signal and inhibiting the command of the controlled rectifier, the auxiliary supply device including a first voltage regulator circuit bridged across the said terminals such that the inhibiting device is blocked, the first regulating circuit comprising two complementary conduction paths of which the impedances vary inversely when the mains voltage increases, one of said paths comprising a ballast semi-conductor, the second regulation circuit comprising means for causing delay in the starting of the controlled rectifier and for charging, during this delay, a capacitor to a substantially constant voltage.

2. A detector, according to claim 1, wherein the first regulating circuit includes a first and a second resistor and a Zener diode in series with the inhibiting device, a ballast semi-conductor in series with a third resistor and the said capacitor and forming one of the said conducting paths, and an exciter transistor in series with the first resistor and the said capacitor and forming the other conducting path, the ballast semi-conductor having a common electrode connected to the common point between the first and the second resistor and to the input electrode of the exciter transistor, the latter having a command electrode connected to the common point between the second resistor and the Zener diode.

3. A detector, according to claim 2, wherein the ballast semi-conductor is a thyristor operating below its maintaining current.

4. A detector, according to claim 1, wherein the said means of causing a delay in the starting include a first and a second Zener diode and a diode, the first Zener diode being connected in series opposition with the ballast semi-conductor and with said diode, the second Zener diode connecting the common point of the first Zener diode and of the diode to the command electrode of the controlled rectifier and to the inhibiting device.

5. A detector, according to claim 2, wherein the said means of causing a delay in the starting include a first and a second Zener diode and a diode, the first Zener diode being connected in series opposition with the ballast semi-conductor and with said diode, the second Zener diode connecting the common point of the first Zener diode and of the diode to the command electrode of the controlled rectifier and to the inhibiting device.

6. A detector, according to claim 3, wherein the said means of causing a delay in the starting include a first and a second Zener diode and a diode, the first Zener diode being connected in series opposition with the ballast semi-conductor and with said diode, the second Zener diode connecting the common point of the first Zener diode and of the diode to the command electrode of the controlled rectifier and to the inhibiting device.

7. A detector, according to claim 2, wherein the assembly formed by the first Zener diode and the diode is connected in parallel across the third resistor, and a fourth resistor shunts the path between the command electrode and the cathode of the controlled rectifier.

8. A detector, according to claim 4, wherein the assembly formed by the first Zener diode and the diode is connected in parallel across said third resistor, and a fourth resistor shunts the path between the command electrode and the cathode of the controlled rectifier.

* * * * *